United States Patent
McCombs (10) Patent No.: US 9,584,122 B1
(45) Date of Patent: Feb. 28, 2017

(54) INTEGRATED CIRCUIT POWER REDUCTION THROUGH CHARGE

(71) Applicant: Apple Inc., Cupertino, CA (US)

(72) Inventor: Edward M. McCombs, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/189,134

(22) Filed: Jun. 22, 2016

(51) Int. Cl.
  *G11C 5/14* (2006.01)
  *H03K 19/00* (2006.01)
  *H03K 3/356* (2006.01)
  *H03K 19/096* (2006.01)
  *G11C 11/40* (2006.01)

(52) U.S. Cl.
  CPC .......... *H03K 19/0019* (2013.01); *G11C 11/40* (2013.01); *H03K 3/356104* (2013.01); *H03K 19/0963* (2013.01)

(58) Field of Classification Search
  CPC ....... G11C 7/1051; G11C 7/1078; G11C 7/22; G11C 7/1057; G11C 7/106; G11C 7/1084; G11C 7/1087; G11C 11/56; G11C 11/5621; G11C 11/5628; G11C 11/5635; G11C 11/5642; G11C 11/5678; G11C 13/0004; G11C 16/08
  USPC ......... 365/230.06, 189.05, 207, 208, 51, 63, 365/185.03, 185.2, 189.09, 191, 194, 203, 365/205, 233.5, 154, 156, 185.22, 189.07
  See application file for complete search history.

(56) References Cited

U.S. PATENT DOCUMENTS

| | | | |
|---|---|---|---|
| 5,859,548 A | 1/1999 | Kong | |
| 7,511,552 B2 | 3/2009 | Ali et al. | |
| 7,599,212 B2 | 10/2009 | Cheng et al. | |
| 8,570,791 B2 | 10/2013 | Liu | |
| 2009/0034315 A1* | 2/2009 | Yu | G11C 8/08 365/51 |

* cited by examiner

*Primary Examiner* — Thong Q Le
(74) *Attorney, Agent, or Firm* — Anthony M. Petro; Meyertons, Hood, Kivlin, Kowert & Goetzel, P.C.

(57) ABSTRACT

Techniques for charge reuse in an integrated circuit. A processor may include a first logic circuit coupled to a source power supply node, a second logic circuit coupled to a destination power supply node, and a charge reuse circuit that selectively transfers charge from the first logic circuit to the second logic circuit. The charge reuse circuit may include an equalization device that selectively couples the source power supply node to the destination power supply node, and an equalization activation circuit that activates the equalization device in response to detecting assertion of an equalization control signal and further detecting that a voltage differential between the source power supply node and the destination power supply node is above a threshold value. The equalization activation circuit also prevents coupling of either the source power supply node or the destination power supply node to ground during activation of the equalization device.

20 Claims, 7 Drawing Sheets

INTEGRATED CIRCUIT POWER REDUCTION THROUGH CHARGE

BACKGROUND

Technical Field

Embodiments described herein relate to the field of processors and more particularly, to techniques for reducing power consumption in memory arrays.

Description of the Related Art

A processor is generally hardware circuitry designed to execute the instructions defined in a particular instruction set architecture implemented by the processor, for the purpose of implementing a wide variety of functionality specified by software developers. To implement a given architecture, processors typically include a variety of types of circuits. For example, a processor may include functional units that are designed to operate on data to produce arithmetic, logical, or other types of results. Functional units and other execution-related processor logic may be implemented using combinational logic gates that implement various Boolean functions, often in combination with state elements such as registers, latches, flip-flops, or the like. A processor may also include storage arrays that are primarily designed to store data rather than process or transform it; storage arrays may be used within processors to implement various types of caches, register files, queues, buffers, or other types of storage structures.

Power requirements tend to substantially influence the cost and performance of a system that employs a particular integrated circuit design. For example, excessive power requirements may in turn require more expensive circuit packaging and cooling. In mobile applications, power consumption directly affects battery life and total device run time. Accordingly, the power requirements of various circuits within an integrated circuit may have far-reaching implications for system cost and performance.

SUMMARY

Systems, apparatuses, and methods for implementing a charge reuse circuit are contemplated.

In various embodiments, an integrated circuit may include a source power supply node configured to supply power to a first logic circuit, a destination power supply node configured to supply power to a second logic circuit, and an equalization device configured to selectively couple the source power supply node to the destination power supply node. The integrated circuit may also include a pulldown network coupled to receive an equalization control signal, a source node input, and a destination node input and configured to selectively activate the equalization device, a source node control circuit coupled to the source power supply node and an inverted version of the equalization control signal and configured to generate the source node input to the pulldown network, and a destination node control circuit coupled to the destination power supply node and the inverted version of the equalization control signal and configured to generate the destination node input to the pulldown network. A control input of the source node control circuit may be coupled to the destination power supply node, and a control input of the destination node control circuit may be coupled to the source power supply node. The source node control circuit, the destination node control circuit, the pulldown network, and the equalization device may be collectively configured to cause charge to transfer between the source power supply node and the destination power supply node in response to assertion of the equalization control signal.

In various embodiments, a processor may include a first logic circuit coupled to a source power supply node, a second logic circuit coupled to a destination power supply node, and a charge reuse circuit configured to selectively transfer charge from the first logic circuit to the second logic circuit. The charge reuse circuit may include an equalization device configured to selectively couple the source power supply node to the destination power supply node, and an equalization activation circuit configured to activate the equalization device in response to detecting assertion of an equalization control signal and further detecting that a voltage differential between the source power supply node and the destination power supply node is above a threshold value. The equalization activation circuit may be further configured to prevent coupling of either the source power supply node or the destination power supply node to ground during activation of the equalization device.

In various embodiments, a method may include generating, by an equalization controller circuit, state information indicative of operating state of a first logic circuit and a second logic circuit, where the first logic circuit is coupled to a source power supply node and the second logic circuit is coupled to a destination power supply node. The method may further include the equalization controller activating an equalization control signal dependent upon the state information, and a source node control circuit generating a source node input to a pulldown network. The source node control circuit may be coupled to the source power supply node and an inverted version of the equalization control signal, and a control input of the source node control circuit may be coupled to the destination power supply node. The method may further include the pulldown network generating an activation signal dependent upon the source node input to the pulldown network and the equalization control signal, and transferring charge between the source power supply node and the destination power supply node via an equalization device in response to the activation signal. During the transferring of charge, the equalization activation circuit may prevent coupling of the source power supply node to ground.

BRIEF DESCRIPTION OF THE DRAWINGS

The above and further advantages of the methods and mechanisms may be better understood by referring to the following description in conjunction with the accompanying drawings, in which.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described here. It will be appreciated that for simplicity and clarity of illustration, elements shown in the figures have not necessarily been drawn to scale. For example, the dimensions of some of the elements may be exaggerated relative to other elements.

This specification includes references to "an embodiment." The appearance of the phrase "in an embodiment" in different contexts does not necessarily refer to the same embodiment. Particular features, structures, or characteristics may be combined in any suitable manner consistent with this disclosure. Furthermore, as used throughout this application, the word "may" is used in a permissive sense (i.e., meaning "having the potential to"), rather than the mandatory sense (i.e., meaning "must"). Similarly, the words "include," "including," and "includes" mean including, but not limited to.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "A system comprising a processor . . . ." Such a claim does not foreclose the system from including additional components (e.g., a display, a memory controller).

"Configured To." Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112(f) for that unit/circuit/component. Additionally, "configured to" can include generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B. "Dependent on" may be employed as a synonym for "based on."

"In Response To." As used herein, this term is used to describe causality of events or conditions. For example, in the phrase "B occurs in response to A," there is a cause-and-effect relationship in which A causes B to occur. It is noted that this phrase does not entail that A is the only event that causes B to occur; B may also occur in response to other events or conditions that may be independent of or dependent on A. Moreover, this phrase does not foreclose the possibility that other events or conditions may also be required to cause B to occur. For example, in some instances, A alone may be sufficient to cause B to happen, whereas in other instances, A may be a necessary condition, but not a sufficient one (such as in the case that "B occurs in response to A and C").

"Each." With respect to a plurality or set of elements, the term "each" may be used to ascribe some characteristic to all the members of that plurality or set. But absent language to the contrary, use of "each" does not foreclose the possibility that other instances of the element might not include the characteristic. For example, in the phrase "a plurality of widgets, each of which exhibits property A," there must be at least two (and possibly arbitrarily many) widgets that exhibit property A. But without more, this does not foreclose the possibility of an additional widget, not a member of the plurality, that does not exhibit property A. In other words, absent language to the contrary, the term "each" does not refer to every possible instance of an element, but rather every element in a particular plurality or set.

Figure 1:
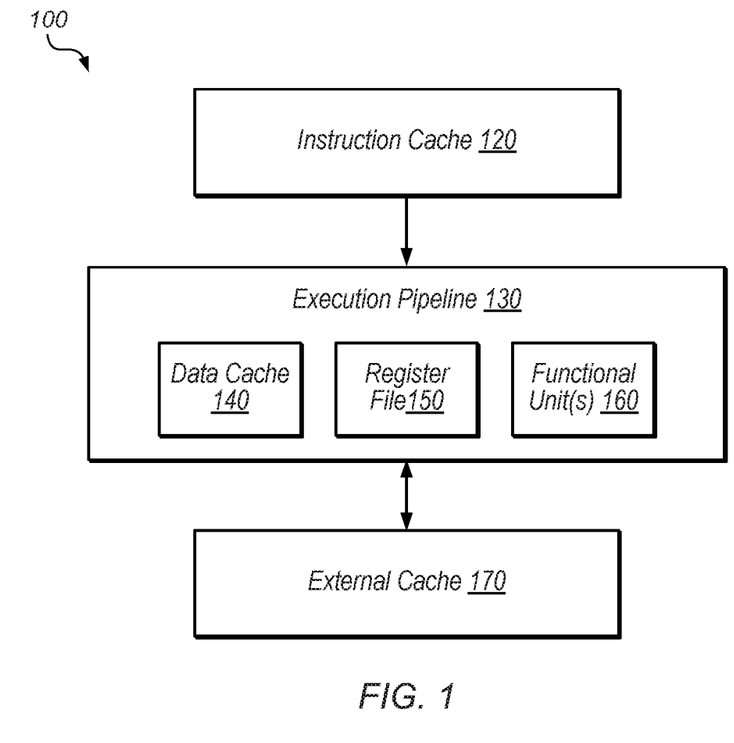
FIG. 1 is a block diagram illustrating an embodiment of an integrated circuit.

Turning now to FIG. 1, a block diagram of one embodiment of a portion of an integrated circuit 100 is shown. In various embodiments, integrated circuit 100 may correspond to a general-purpose processor, an embedded processor, a graphics processor, a digital signal processor (DSP), or any other type of processor that is generally capable of operating on digital data. In the illustrated embodiment, integrated circuit 100 includes an instruction cache 120 coupled to an execution pipeline 130, which is in turn coupled to an external cache 170. As shown in FIG. 1, execution pipeline 130 further includes a data cache 140, a register file 150, and one or more functional units 160.

As a preliminary matter, it is noted that FIG. 1 is intended to illustrate several components that tend to be common to many digital integrated circuit designs. These components are illustrated at a high level of abstraction in order to facilitate the discussion of more particular features below. It is noted that integrated circuit 100 may include numerous features in addition to those shown, and may be organized in any suitable fashion beyond that shown here.

Instruction cache 120 may generally be configured to store instructions for execution by execution pipeline 130. For example, instruction cache 120 may be configured to fetch instructions from external storage (such as system memory) well in advance of when those instructions are expected to be executed, in order to hide the latency of accessing external storage. In various embodiments, instruction cache 120 may be configured according to any suitable cache architecture (e.g., direct-mapped, set-associative, etc.). Integrated circuit 100 may also include other circuitry related to instruction fetch and issuance, such as instruction decode and/or issue logic, which may be included within instruction cache 120 or elsewhere. In some embodiments, instruction cache 120 or another component of integrated circuit 100 may include branch prediction circuitry, predication circuitry, or other features relating to the conditional or speculative execution of instructions.

Execution pipeline 130 may generally be configured to execute instructions issued from instruction cache 120 to perform various operations. Such instructions may be defined according to an instruction set architecture (ISA), such as the x86 ISA, the PowerPC™ ISA, the ARM™ ISA, or any other suitable architecture.

In the illustrated embodiment, execution pipeline 130 includes data cache 140. Similar to instruction cache 120, data cache 140 may provide temporary storage for data retrieved from another, slower memory within a memory hierarchy. Instructions executed by execution pipeline 130 may access the contents of data cache 140 through explicit load or store instructions, or via other instructions that implicitly reference load/store operations in combination with other operations, depending on the characteristics of the implemented ISA. Data cache 140 may be organized as direct-mapped, set-associative, or according to any other suitable cache geometry, and may implement single or multiple read and write ports.

Register file 150, also an illustrated component of execution pipeline 130, may be configured as architecturally-visible registers and/or registers distinct from those specified by the ISA. For example, an ISA may specify a set of registers (such as a set of 32 64-bit registers denoted R0 through R31, for example) that executable instructions may specify as the source of data operands. However, in order to implement performance-improving schemes such as register renaming, register file 150 may implement a larger number of physical registers than those defined by the ISA, allowing architectural registers to be remapped to physical registers in ways that help resolve certain types of data dependencies between instructions. Accordingly, register file 150 may be substantially larger than the minimum set of architecturally-visible registers defined by the ISA. Moreover, register file 150 may be implemented in a multi-ported fashion in order to support multiple concurrent read and write operations by different, concurrently-executing instructions. In various embodiments, logic to perform register renaming, port scheduling and/or arbitration, or any other aspects relating to the operation of register file 150 may be included within register file 150 itself or within another unit.

Functional unit(s) 160 may be configured to carry out many of the various types of operations specified by a given ISA. For example, functional unit(s) 160 may include combinatorial logic configured to implement various arithmetic and/or logical operations, such as integer or floating-point arithmetic, Boolean operations, shift/rotate operations, address arithmetic for load/store operations, or any other suitable functionality. In some embodiments, execution pipeline 130 may include multiple different functional units 160 that differ in terms of the types of operations they support. For example, execution pipeline 130 may include a floating point unit configured to perform floating-point arithmetic, one or more integer arithmetic/logic units (ALUs) configured to perform integer arithmetic and Boolean functions, a graphics unit configured to implement operations particular to graphics processing algorithms, a load/store unit configured to execute load/store operations, and/or other types of units.

External cache 170 may be configured as an intermediate cache within a memory hierarchy. For example, external cache 170 may be a second-level cache interposed between external system memory and the first-level instruction cache 120 and data cache 140. Although often larger and slower than first-level caches, external cache 170 may nevertheless be substantially faster to access than external random-access memory (RAM), and its inclusion may improve the average latency experience by a typical load or store operation. External cache 170 may be configured according to any suitable cache geometry, which may differ from the geometries employed for instruction cache 120 and/or data cache 140. In some embodiments, still further caches may be interposed between external cache 170 and system memory.

Many of the elements discussed above share the common characteristic that they may include storage arrays that are configured to store substantial quantities of data for subsequent retrieval and use. For example, although their configurations may differ to suit their different roles, each of instruction cache 120, data cache 140, and external cache 170 may be configured to store data on the order of kilobytes, megabytes, or more. Similarly, although register file 150 may have different bandwidth requirements than the various caches, it nevertheless may be implemented as a storage array of the general organization to be discussed shortly. Finally, functional unit(s) 160 may include data structures such as buffers (e.g., load/store buffers) that lend themselves to implementation as storage arrays.

Although various examples of storage arrays have been discussed above, it is noted that integrated circuit 100 may include numerous instances of logic circuits that are not structured as arrays. For example, combinatorial logic circuits, whether synthesized or custom-designed, may be employed for a variety of tasks such as performing control (e.g., implementing state machines, decoders, and other types of control logic) or operations on data (e.g., implementing adders, multipliers, shifters, and other types of datapath logic). It is contemplated that the techniques described herein may be employed with respect to both array and non-array circuit types.

Figure 2:
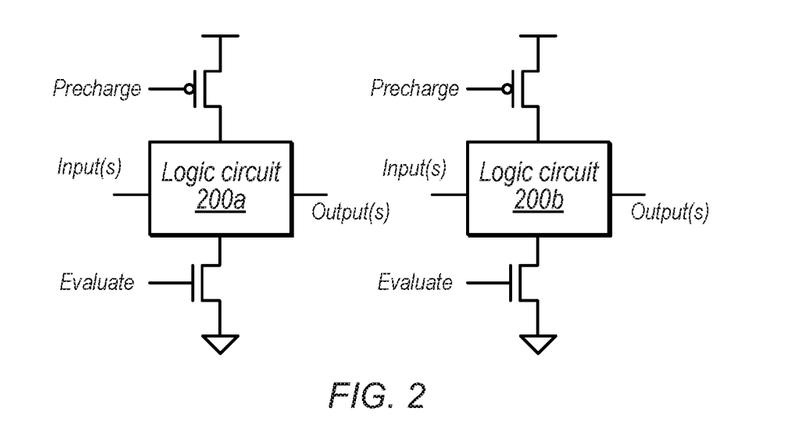
FIG. 2 illustrates a style of clocked or dynamic logic that may be employed within circuits of an integrated circuit.

FIG. 2 illustrates a style of clocked or dynamic logic that may be frequently employed within various circuits of integrated circuit 100. Generally speaking, dynamic logic circuits may operate in two distinct modes: during a precharge mode of operation, the logic circuit is precharged to a known voltage, and during an evaluate mode of operation, the logic circuit conditionally discharges dependent upon its input(s) to determine the value of its output(s). FIG. 2 illustrates an embodiment of two different logic circuits 200a-b, each of which is coupled to a voltage source via a respective precharge device and to ground via a respective evaluate device. As shown, the precharge and evaluate devices are P-type and N-type field effect transistors (PFETs/NFETs), respectively, although other suitable types of devices may be employed. In various embodiments, the precharge and evaluate phases of operation of logic circuits 200a-b may be controlled by the same precharge and evaluate signals, or by different versions of these signals (e.g., using multi-phase clocks or separately gated clocks to differently generate the precharge and evaluate signals for different logic circuits).

Once precharged, it is possible that a given logic circuit may not discharge during the evaluate mode. Whether or not logic circuits 200a-b discharge through their evaluate devices typically depends on the state of their input(s). For example, if the state of the inputs to logic circuit 200a fails to create a path to ground through the evaluate device, then the charge accumulated in logic circuit 200a during precharge (typically on a precharge node within logic circuit 200a that is located nearby the precharge device) may remain stored within logic circuit 200a until a subsequent evaluation occurs, or until it gradually dissipates due to effects such as parasitic leakage. In a different scenario, even if logic circuit 200a does discharge through the evaluate device during the evaluate mode, it may not discharge completely before the evaluate device is turned off. This scenario may also leave some amount of residual charge stored within logic circuit 200a until it is discharged or dissipates.

If residual charge that remains stored within logic circuit 200a dissipates before it can be used to perform useful computation, such dissipation represents wasted energy that may contribute to increased power consumption within integrated circuit 100, as well as a source of heat. To the extent such residual charge could be transferred elsewhere within integrated circuit 100, it may be possible to use at least a portion of such charge to perform computational work rather than allow it to be entirely dissipated, and thus wasted.

Figure 3:
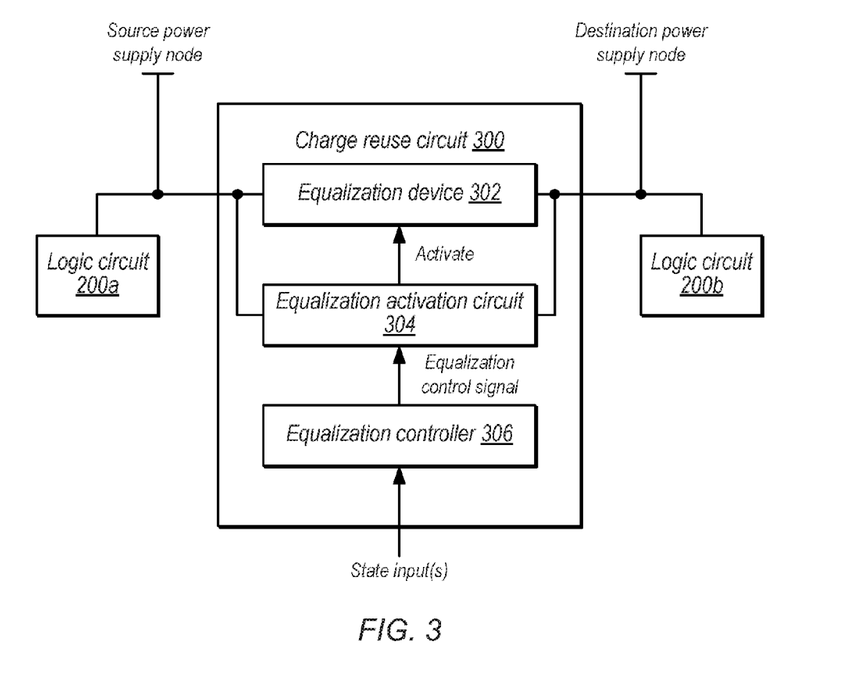
FIGS. 3-4 illustrate an embodiment of a charge reuse circuit and an embodiment of a method of its operation.

FIG. 3 illustrates an embodiment of a charge reuse circuit that may enable unused charge in one logic circuit that would otherwise have dissipated to be at least partially transferred to another circuit in which the transferred charge may be used. Specifically, FIG. 3 illustrates charge reuse circuit 300 interposed between logic circuits 200a-b. (For clarity of presentation, some details in FIG. 2 concerning logic circuits 200a-b are omitted from FIG. 3.) In the illustrated embodiment, charge reuse circuit 300 includes an equalization device 302 that is coupled to a source power supply node that is also coupled to logic circuit 200a. Equalization device 302 is also coupled to a destination power supply node that is also coupled to logic circuit 200b. Charge reuse circuit 300 further includes an equalization activation circuit 304 coupled to activate equalization device 302, and an equalization controller 306 coupled to receive state input(s) and to generate an equalization control signal input to equalization activation circuit 304.

Figure 4:
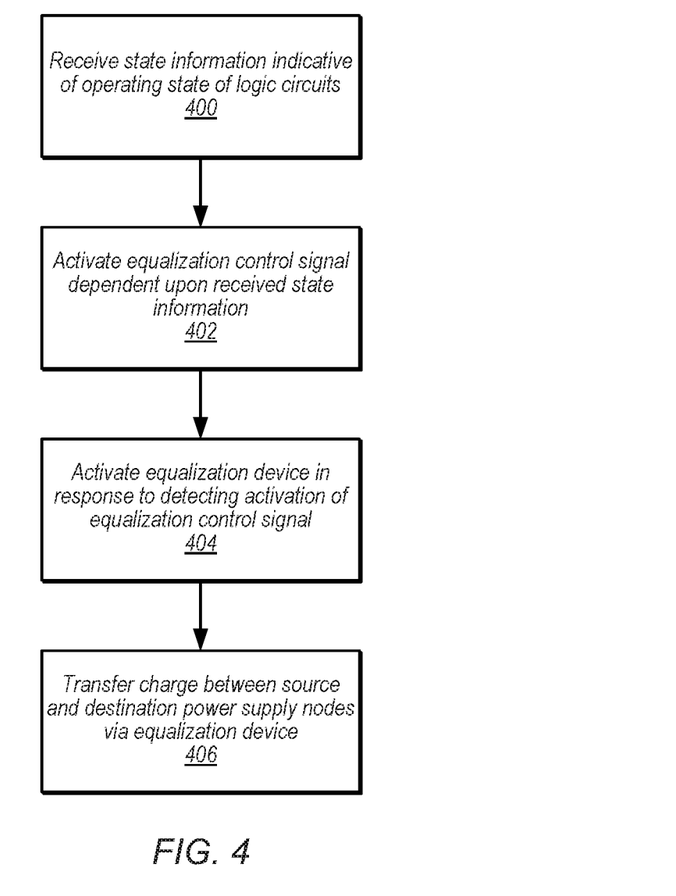

FIG. 4 illustrates an embodiment of a method of operation of charge reuse circuit 300. In the illustrated embodiment, operation begins in block 400 in which state information is received that is indicative of the operating state of logic circuits 200a-b. For example, equalization controller 306 may be coupled to receive information from other circuits within integrated circuit 100 that indicates whether either or both of logic circuits 200a-b are expected to be active (e.g., evaluated) during a future cycle. In some embodiments, as discussed in greater detail below, the state information may indicate expected operating state transitions for logic circuits 200a-b, such as whether each of logic circuits 200a-b is transitioning from an active state to an inactive state, or vice versa.

At block 402, an equalization control signal is activated dependent upon the received state information. For example, equalization controller 306 may decode the received state information and use that information to conditionally assert the equalization control signal that is provided to equalization activation circuit 304. Further details concerning examples of how the equalization control signal may be determined are discussed in greater detail below.

At block 404, equalization device 302 is activated in response to detecting activation of the equalization control signal and further detecting that a voltage differential between the source power supply node and the destination power supply node is above a threshold value. For example, equalization activation circuit 304 may take into account both the assertion of the equalization control signal and the current state of the source and destination power supply nodes. In the illustrated embodiment, even if the equalization control signal is asserted, equalization device 302 may not be activated unless the difference in voltage between the source and destination power supply nodes at least exceeds a threshold value.

At block 406, charge is transferred between the source power supply node and the destination power supply node via equalization device 302. That is, equalization device 302 provides a path through which residual charge within one of logic circuits 200a-b may be transferred to the other instead of merely being dissipated through disuse.

Although not all charge may be transferred between logic circuits 200a-b, the charge that is transferred may substantially reduce the degree to which the receiving circuit needs to be further precharged from a power supply. For example, suppose a fully precharged voltage level is 1000 mV, and suppose further that logic circuits 200a-b are at levels of 800 mV (mostly precharged) and 200 mV (mostly discharged). Upon activation of equalization device 302, logic circuits 200a-b might settle at approximately 500 mV each (neglecting losses that might occur in the course of charge transfer). In this example, the receiving circuit only needs a further 500 mV of potential from the power supply to reach a fully precharged 1000 mV, instead of the 800 mV of potential that would have been required absent charge reuse circuit 300.

It is noted that the term "equalization," as used herein, reflects the fact that when two different nodes are electrically connected, the charge present on the two nodes will tend to become equally distributed, at a rate subject to the electrical resistance and the voltage differential between the two nodes. For a variety of reasons, the charge may not become exactly equally distributed, and the voltage differential between the two nodes may not become exactly zero, although the general behavior of the circuit will tend towards equal charge distribution and equal voltage potential at the two nodes.

It is also noted that in FIG. 3, "source" and "destination" are merely labels used to distinguish various elements, and are not necessarily indicative of the direction in which current will flow. That is, if the destination power supply node is at a higher voltage than the source power supply node when the equalization control signal is asserted, then charge may flow from the destination to the source. Moreover, although only two nodes are shown in FIG. 3, it is contemplated that this circuit could be extended to encompass three or more distinct logic circuits 200 and corresponding power supply nodes.

As generally described above, charge reuse circuit 300 may permit the selective transfer of charge between two (or more) different logic circuits 200. The particular control scheme implemented by equalization controller 306 may vary dependent upon factors such as the complexity or simplicity of the controller design, usage patterns of logic circuits 200a-b, and/or other design factors. For example, in one embodiment, equalization controller 306 may be configured to activate the equalization control signal in response to determining that either of logic circuits 200a-b is about to perform an operation (e.g., during the next relevant operational cycle that is being evaluated). This relatively simple approach takes into account only the future state of logic circuits 200a-b rather than their current states relative to one another, and may result in the equalization control signal being asserted more frequently, without regard for whether charge will actually be transferred between the source and destination when this occurs.

In another embodiment, equalization controller 306 may be configured to activate the equalization control signal in response to determining that either (1) logic circuit 200a is transitioning from an active state to an inactive state and logic circuit 200b is transitioning from an inactive state to an active state, or (2) logic circuit 200b is transitioning from an active state to an inactive state and logic circuit 200a is transitioning from an inactive state to an active state. In this somewhat more complex scheme, the equalization control signal may be asserted less often, but charge transfer is more likely to occur, because it is more likely that there will be a voltage differential between the source and destination nodes when one of them is transitioning from active to inactive and the other is transitioning in the opposite direction.

In the foregoing discussion, logic circuits 200a-b may correspond to any two circuits that are identified as potential candidates for implementing charge reuse. In various embodiments, logic circuits 200a-b may be selected according to a particular type of relationship they exhibit. For example, logic circuits 200a-b may be coupled for charge reuse on the basis that they are capable of mutually exclusive operation in terms of functionality. That is, logic circuits 200a-b may be configured to implement different functional operations that may tend to be complementary (e.g., on at least some occasions, not performed concurrently).

Figure 5A:
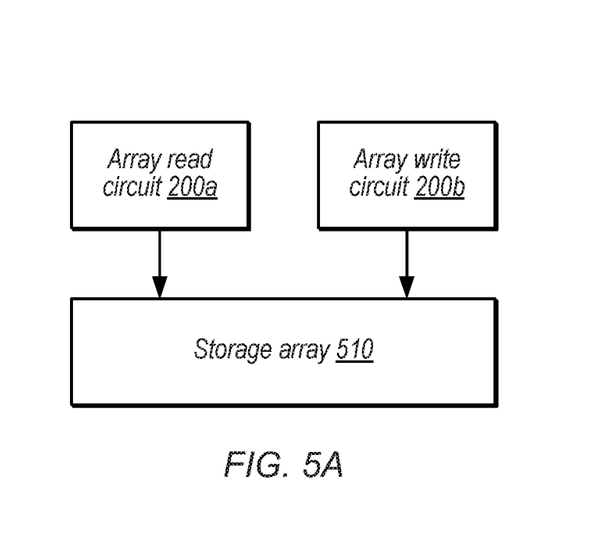
FIGS. 5A-C illustrate examples of how logic circuits may be identified as potential candidates for implementing a charge reuse circuit.

For example, as shown in FIG. 5A, logic circuit 200a may be an array read circuit configured to perform read operations associated with accessing a storage array 510, whereas logic circuit 200b may be an array write circuit configured to perform write operations associated with storage array 510. (Storage array 510 may correspond to any type of memory structure, such as a cache, register file, buffer, dynamic memory, etc.). Although read and write operations might be performed concurrently in this example, there might also be occasions where a read operation is followed by a write operation or vice versa, which might offer opportunities to reuse charge that might otherwise be wasted. It is noted that although array read and write operations are one example of a functional relationship that might be employed to select logic circuits 200a-b, many other types of functional relationships are possible and contemplated. For example, an integer functional unit might contain several functional subunits, such as an adder and a shifter, that might correspond to logic circuits 200a-b.

Figure 5B:
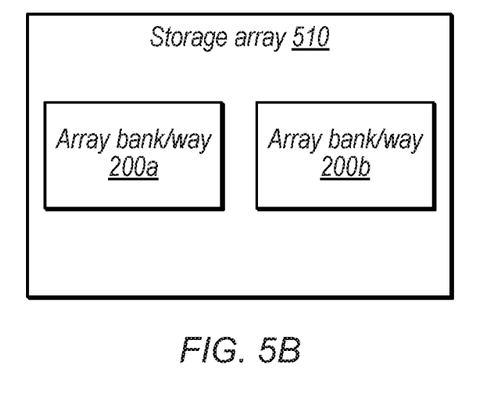

Logic circuits 200a-b may also be chosen on the basis that they are capable of mutually exclusive operation in terms of structure. For example, in FIG. 5B, storage array 510 is organized in terms of distinct subarrays, such as banks or ways, of which only one or a subset of the subarrays are selected at any given time. In this example, logic circuit 200a may correspond to one bank or way, and logic circuit 200b may correspond to a different bank/way.

Figure 5C:
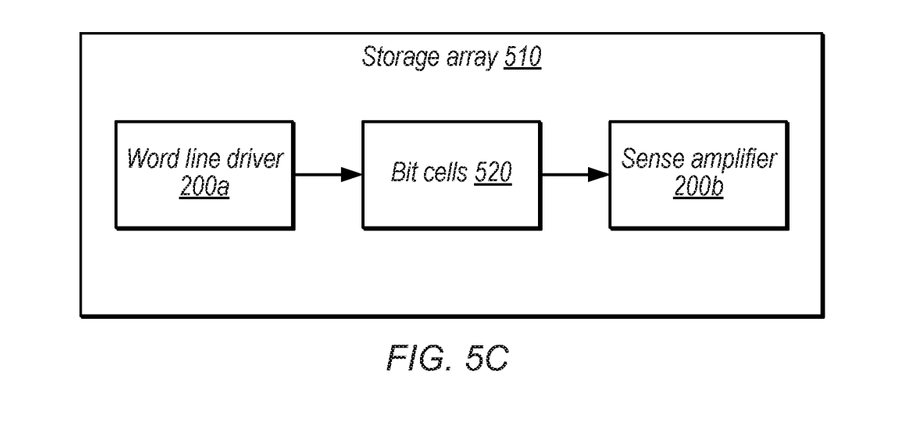

Logic circuits 200a-b may also be chosen on the basis that they are capable of mutually exclusive operation in terms of temporality (e.g., operation at different points in time). Generally speaking, this scenario may arise when logic circuits 200a-b are located at different stages of a multi-stage logic path, where one of logic circuits 200a-b is located upstream relative to the other (which may in turn be considered to be a downstream component). For example, logic circuits 200a-b may correspond to circuits at different stages of a multi-cycle pipeline that operates over several clock cycles, or may correspond to different stages of logic that operate at different points in time during a single clock cycle.

One example is illustrated in FIG. 5C, which shows a highly simplified representation of several components that may be implemented within the read path of storage array 510. In the illustrated embodiment, operation may begin with word line driver 200a decoding a word line that selects a particular row of an array of bit cells 520 that is to be read. In turn, the selected bit cells 520 may output their stored value in a small-signal differential encoding that is subsequently amplified by sense amplifier 200b before the read data is output from storage array 510. In this example, word line driver 200a, bit cells 520, and sense amplifier 200b operate in sequence. Thus, it may be advantageous to implement charge reuse between, e.g., word line driver 200a and sense amplifier 200b. Numerous other scenarios are possible and contemplated, including implementations between logic circuits 200a-b outside the context of a storage array.

Figure 6:
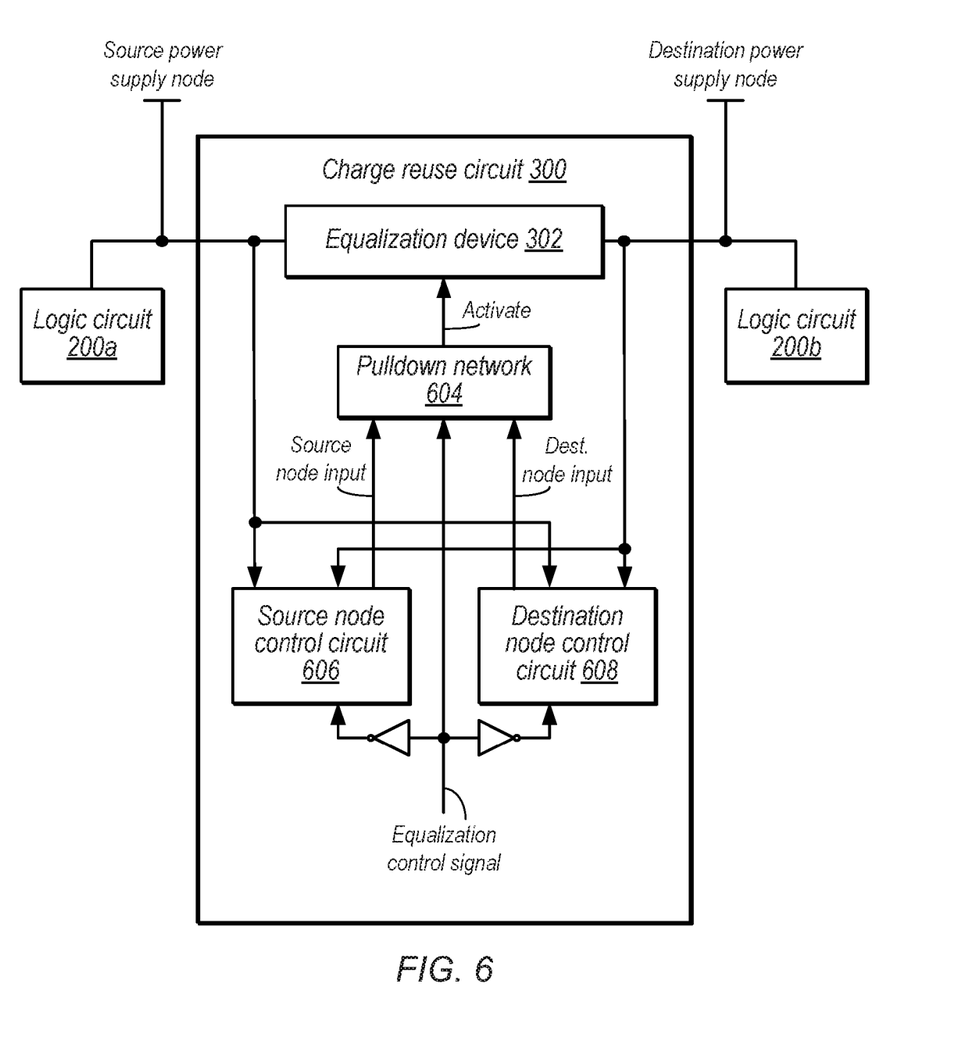
FIGS. 6-7 are block and circuit diagrams illustrating embodiments of a charge reuse circuit in greater detail.

FIG. 6 illustrates a block diagram that shows an embodiment of charge reuse circuit 300 in greater detail. For simplicity of presentation, elements corresponding to equalization controller 306 of FIG. 3 are omitted in FIG. 6, it being understood that the particular manner of control employed by charge reuse circuit 300 will vary according to various design parameters such as the nature of logic circuits 200a-b and the particular circumstances in which equalization is desired to be performed.

In the embodiment of FIG. 6, a source power supply node is shown coupled to logic circuit 200a, and a destination power supply node is coupled to logic circuit 200b. Charge reuse circuit 300 is shown coupled between these two nodes, and includes equalization device 302 which, as described previously, may be configured to selectively couple the source power supply node to the destination power supply node, for example in response to assertion of the illustrated activation signal. In the illustrated embodiment, charge reuse circuit 300 also includes pulldown network 604 that is coupled to receive an equalization control signal, a source node input, and a destination node input. Pulldown network 604 is configured to selectively activate equalization device 302, for example dependent upon the state of the three illustrated inputs.

Charge reuse circuit further includes a source node control circuit 606 and a destination node control circuit 608. Both of these are coupled to an inverted version of the equalization control signal, and are respectively configured to generate the source node and destination node inputs to pulldown network 604. Moreover, a control input of source node control circuit 606 is coupled to the destination power supply node, and a control input of destination node control circuit 608 is coupled to the source power supply node. Collectively, source node control circuit 606, destination node control circuit 608, pulldown network 604, and equalization device 302 may be configured to cause charge to transfer between the source power supply node and the destination power supply node in response to assertion of the equalization control signal.

Figure 7:
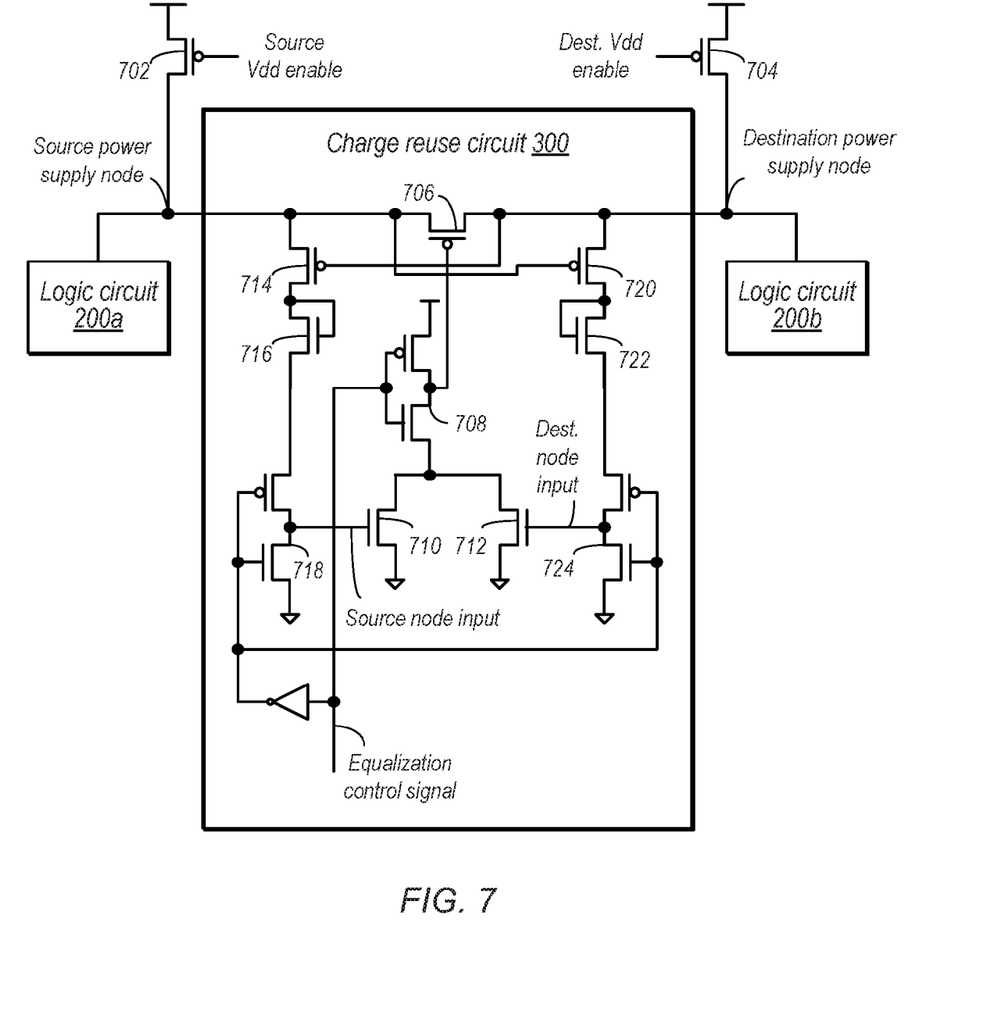

FIG. 7 illustrates an example of how the embodiment of FIG. 6 could be implemented using N-type and P-type field effect transistors (NFETs/PFETs), it being noted that other types of devices arranged in different manners are possible and contemplated. Preliminarily, FIG. 7 illustrates that each of the source and destination power supply nodes may be selectively activated using PFETs 702-704, respectively. Although these devices are optional, their inclusion may enable logic circuits 200a-b to be depowered, e.g., for power management purposes.

As shown in FIG. 7, equalization device 302 of FIG. 6 may be implemented using one or more PFETs 706. Pulldown network 604 of FIG. 6 may be implemented with a pulldown inverter 708 that is coupled to ground via pulldown NFETs 710-712, which are coupled in parallel and are respectively coupled to the source node and destination node inputs of pulldown network 604. An output of pulldown inverter 708 is coupled to selectively control equalization PFET 706, and an input of pulldown inverter 708 is coupled to the equalization control signal.

Source node control circuit 606 may be implemented by a source node PFET 714 and a source node control inverter 718 coupled in series between the source power supply node and ground. A gate of source node PFET 714 is coupled to the destination power supply node, and an input of source node control inverter 718 is coupled to an inverted version of the equalization control signal. An output of source node control inverter 718 is coupled to the source node input of pulldown network 604. It is noted that source node control inverter 718 may prevent coupling of the source power supply node to ground during activation of equalization PFET 706. That is, when the equalization control signal is asserted (e.g., in a high logic state), the input to source node control inverter 718 is the inverted version of this signal, and thus deasserted. As a result, the NFET of source node control inverter 718 is inactive, isolating the source power supply node from ground. This configuration may assist in preventing so-called "crowbar" events, which may arise when a power supply node is inadvertently short-circuited to ground, and which can cause destructive circuit failures.

In a similar fashion, destination node control circuit 608 may be implemented by a destination node PFET 720 and a destination node control inverter 724 coupled in series between the destination power supply node and ground. A gate of destination node PFET 720 is coupled to the source power supply node, and an input of destination node control inverter 724 is coupled to an inverted version of the equalization control signal. An output of destination node control inverter 724 is coupled to the destination node input of pulldown network 604. Destination node control inverter 724 may prevent coupling of the destination power supply node to ground during activation of equalization PFET 706 in a manner similar to that discussed above.

The embodiment of FIG. 7 further includes a diode-coupled NFET 716 interposed in series between source node PFET 714 and source node control inverter 718, and a similar diode-coupled NFET 722 interposed in series between destination node PFET 720 and destination node control inverter 724. These devices are optional and may be omitted. In some circumstances, inclusion of diode-coupled NFETs 716 and 722 may improve the robustness of operation of charge reuse circuit 300. For example, these devices may be employed as a charge buffer. In order to turn on diode-coupled NFETs 716 and 722, a substantial amount of charge would be needed to meet the NFET threshold voltage, and would need to remain in order to keep the NFET conducting. If there were accidental charge leakage onto the node between source node PFET 714 and NFET 16 (or, similarly, onto the node between destination node PFET 720 and NFET 722), diode-coupled NFETs 716 and 722 may help prevent circuit instability or glitching due to the leaked charge. However, not all embodiments necessarily benefit from the inclusion of NFETs 716 and 722.

It is noted that depending on the amount of charge that is expected to be distributed through equalization PFET 706, this device may be substantially larger than a minimum-sized FET. However, in some embodiments, the remaining devices within charge reuse circuit 300 may be substantially smaller than PFET 706 (e.g., at or closer to minimum size than the size of PFET 706), which may lead to a relatively compact design that does not contribute a substantial increase in area or power consumption of the overall integrated circuit design.

During operation of the illustrated embodiment of charge reuse circuit 300, it is noted that whether or not equalization PFET 706 is enabled, thus allowing charge to transfer between the source and destination power supply nodes, depends on at least two factors: the voltage levels that exist at the source and destination power supply nodes, and the state of the equalization control signal. For example, it is noted that the gate of source node PFET 714 is controlled by the destination power supply node, and the gate of destination node PFET 720 is controlled by the source power supply node. Generally speaking, a PFET device begins conducting when its gate voltage falls below a threshold value (typically relative to the drain terminal of the device). Conversely, an NFET device typically begins conducting when its gate voltage rises above the threshold voltage. Accordingly, if the voltage levels at both the source and destination power supply nodes are above the PFET threshold voltage, then PFETs 714 and 720 will remain in a generally nonconducting or inactive state, and equalization PFET 706 may remain inactive regardless of the state of the equalization control signal.

Even if equalization PFET 706 were to become active in this state, however (e.g., due to parasitic or charge sharing effects that might be exhibited when the equalization control signal is asserted while PFETs 714 and 720 remain inactive), there would typically be little consequence, because the voltage levels at the source and destination power supply nodes would both be relatively high in this scenario. Accordingly, the voltage differential across equalization PFET 706, if any, would be expected to be small, and little charge would be expected to flow between the source and destination power supply nodes even assuming that PFET 706 were activated in this case.

In the scenario where the destination power supply node is below the PFET threshold voltage, but the source power supply node is above it, then the destination power supply node voltage may cause source PFET 714 to become active. Further circuit operation may then depend on the state of the equalization control signal. If the equalization control signal is deasserted (e.g., at a low voltage level corresponding to a logic level of 0) then pulldown inverter 708 may output a high voltage that causes equalization PFET 706 to remain inactive. If the equalization control signal is asserted (e.g., at a high voltage level corresponding to a logic level of 1), then source node control inverter 718 may become decoupled from ground and may allow the source power supply node voltage to pass from source PFET 714 through to the gate of pulldown NFET 710. Provided that this voltage is sufficient to activate pulldown NFET 710, a discharge path may be created through pulldown NFET 710 and pulldown inverter 708, causing the voltage at the gate of equalization PFET 706 to be pulled below its threshold voltage. Activation of equalization PFET 706 may then allow charge to transfer from the source power supply node to the destination power supply node.

It is noted that the illustrated embodiment of charge reuse circuit 300 is symmetrical, in that if the voltage levels of the source and destination power supply nodes are reversed in the foregoing example, then similar operation may occur, but through the destination side devices (PFETs 720-722, NFET 712, and inverter 724) instead of the source side devices. Accordingly, charge transfer may be performed bidirectionally. In some embodiments of charge reuse circuit 300, unidirectional charge transfer may be supported, e.g., by omitting PFETs 720-722, NFET 712, and inverter 724 or corresponding elements on the source side. The resultant circuit may be used, for example, to transfer charge in a situation where logic circuits 200a-b are in different voltage domains, with a normal operating voltage of one power supply node being different from another. However, the bidirectional embodiment shown in FIG. 7 may also be used in such circumstances.

When both the source and destination power supply nodes are at a low voltage, the ultimate result may be similar to the case described above for which both nodes are at a high voltage. In the low-voltage case, both source and destination PFETs 714, 720 may become active. However, when the equalization control signal is asserted, the low voltage passed through source control inverter 718 to pulldown NFET 710 may be insufficient to activate the latter device (and similarly with respect to destination control inverter 724 and pulldown NFET 712). Accordingly, no discharge path may be created to the gate of equalization PFET 706, which may cause that device to remain inactive. Even if the voltage level at one or both of the source or destination power supply nodes were sufficient to (perhaps weakly) activate NFETs 710 or 712, and thus to (again perhaps weakly) activate equalization PFET 706, the limited voltage differential between the source and destination power supply nodes may result in little or no charge transfer.

Figure 8:
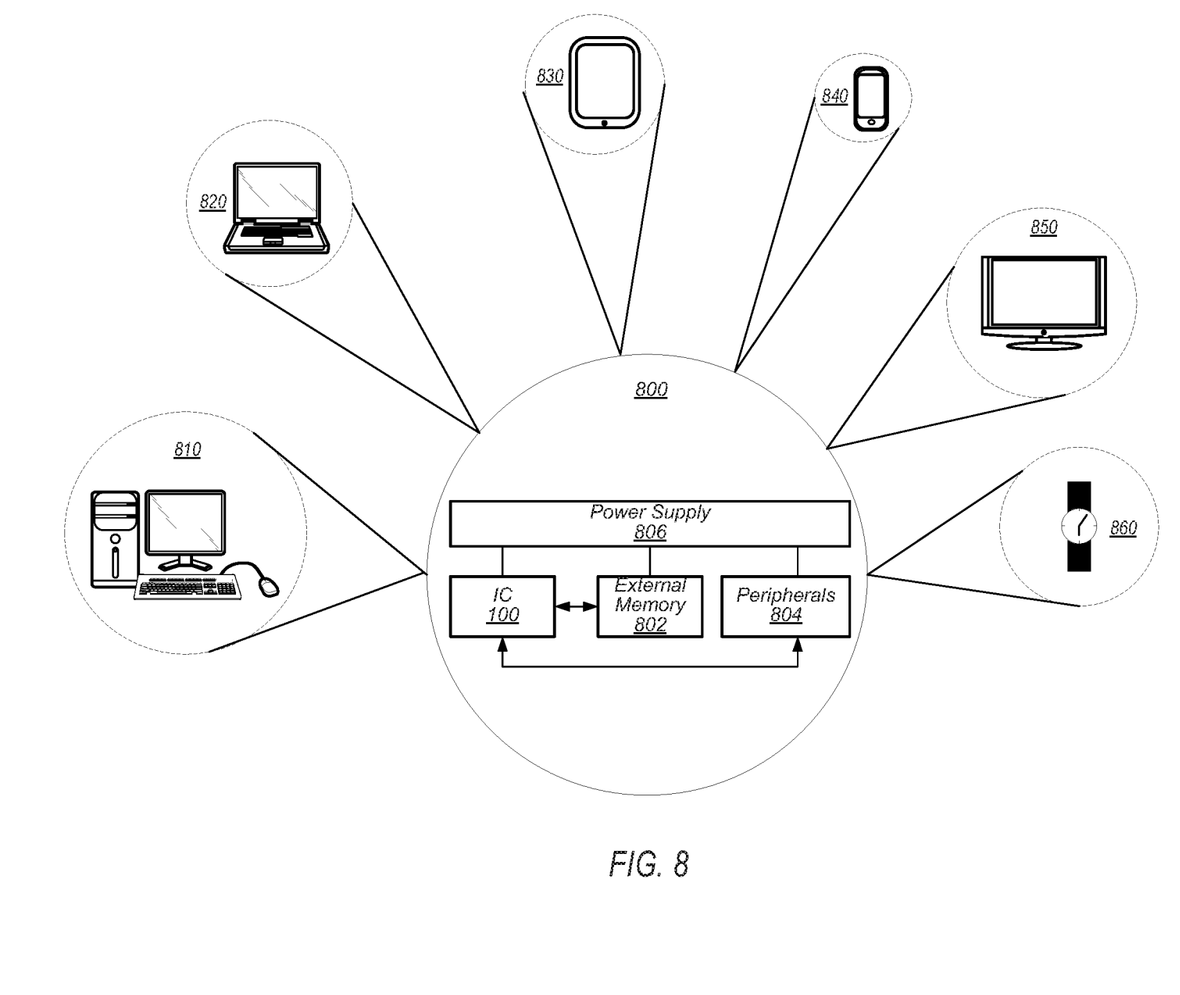
FIG. 8 is a block diagram of an embodiment of a system.

Referring next to FIG. 8, a block diagram of one embodiment of a system 800 is shown. As shown, system 800 may represent chip, circuitry, components, etc., of a desktop computer 810, laptop computer 820, tablet computer 830, cell or mobile phone 840, television 850 (or set top box configured to be coupled to a television), wrist watch or other wearable item 860, or otherwise. Other devices are possible and are contemplated. In the illustrated embodiment, the system 800 includes at least one instance of integrated circuit 100 (of FIG. 1) coupled to an external memory 802. In various embodiments, integrated circuit 100 may be a processor included within a system on chip (SoC) or larger integrated circuit (IC) which is coupled to external memory 802, peripherals 804, and power supply 806. Integrated circuit 100 may employ any of the circuits or techniques described above with respect to FIGS. 2-7, or variations thereof.

Integrated circuit 100 is coupled to one or more peripherals 804 and the external memory 802. A power supply 806 is also provided which supplies the supply voltages to processor 100 as well as one or more supply voltages to the memory 802 and/or the peripherals 804. In various embodiments, power supply 806 may represent a battery (e.g., a rechargeable battery in a smart phone, laptop or tablet computer). In some embodiments, more than one instance of integrated circuit 100 may be included (and more than one external memory 802 may be included as well).

The memory 802 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an SoC or IC containing integrated circuit 100 in a chip-on-chip configuration, a package-on-package configuration, or a multi-chip module configuration.

The peripherals 804 may include any desired circuitry, depending on the type of system 800. For example, in one embodiment, peripherals 804 may include devices for various types of wireless communication, such as wife, Bluetooth, cellular, global positioning system, etc. The peripherals 804 may also include additional storage, including RAM storage, solid state storage, or disk storage. The peripherals 804 may include user interface devices such as a display screen, including touch display screens or multi-touch display screens, keyboard or other input devices, microphones, speakers, etc.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An integrated circuit, comprising:
    a source power supply node configured to supply power to a first logic circuit;
    a destination power supply node configured to supply power to a second logic circuit;
    an equalization device configured to selectively couple the source power supply node to the destination power supply node;
    a pulldown network coupled to receive an equalization control signal, a source node input, and a destination node input and configured to selectively activate the equalization device;
    a source node control circuit coupled to the source power supply node and receiving an inverted version of the equalization control signal and configured to generate the source node input to the pulldown network; and
    a destination node control circuit coupled to the destination power supply node and receiving the inverted version of the equalization control signal and configured to generate the destination node input to the pulldown network, wherein:
    a control input of the source node control circuit is coupled to the destination power supply node;
    a control input of the destination node control circuit is coupled to the source power supply node; and
    the source node control circuit, the destination node control circuit, the pulldown network, and the equalization device are collectively configured to cause charge to transfer between the source power supply node and the destination power supply node in response to assertion of the equalization control signal.

2. The integrated circuit of claim 1, wherein the source power supply node and the destination power supply node are each selectively activated.

3. The integrated circuit of claim 1, wherein the equalization device comprises one or more p-type field effect transistors (PFETs).

4. The integrated circuit of claim 1, wherein the pulldown network comprises a pulldown inverter coupled to ground via parallel first and second pulldown n-type field effect transistors (NFETs), wherein the first and second pulldown NFETs are respectively coupled to the source node input and the destination node input, wherein an output of the pulldown inverter is coupled to selectively control the equalization device, and wherein an input of the pulldown inverter is coupled to the equalization control signal.

5. The integrated circuit of claim 1, wherein the source node control circuit comprises a source node PFET and a source node control inverter coupled in series between the source power supply node and ground, wherein a gate of the source node PFET corresponds to the control input of the source node control circuit that is coupled to the destination power supply node, wherein an input of the source node control inverter is coupled to an inverted version of the equalization control signal, and wherein an output of the source node control inverter is coupled to the source node input to the pulldown network.

6. The integrated circuit of claim 5, wherein the destination node control circuit comprises a destination node PFET and a destination node control inverter coupled in series between the destination power supply node and ground, wherein a gate of the destination node PFET corresponds to the control input of the destination node control circuit that is coupled to the source power supply node, wherein an input of the destination node control inverter is coupled to the inverted version of the equalization control signal, and wherein an output of the destination node control inverter is coupled to the destination node input to the pulldown network.

7. The integrated circuit of claim 6, further comprising:
a first diode-coupled NFET interposed in series between the source node PFET and the source node control inverter; and
a second diode-coupled NFET interposed in series between the destination node PFET and the destination node control inverter.

8. The integrated circuit of claim 1, wherein the first logic circuit and the second logic circuit are capable of mutually exclusive operation in terms of functionality, structure, or temporality.

9. The integrated circuit of claim 1, wherein a normal operating voltage of the source power supply node differs from a normal operating voltage of the destination power supply node.

10. A processor, comprising:
a first logic circuit coupled to a source power supply node;
a second logic circuit coupled to a destination power supply node; and
a charge reuse circuit configured to selectively transfer charge from the first logic circuit to the second logic circuit; the charge reuse circuit comprising:
an equalization device configured to selectively couple the source power supply node to the destination power supply node; and
an equalization activation circuit configured to activate the equalization device in response to detecting assertion of an equalization control signal and further detecting that a voltage differential between the source power supply node and the destination power supply node is above a threshold value;
wherein the equalization activation circuit is further configured to prevent coupling of either the source power supply node or the destination power supply node to ground during activation of the equalization device.

11. The processor of claim 10, further comprising an equalization controller configured to activate the equalization control signal in response to determining that either the first logic circuit or the second logic circuit is about to perform an operation.

12. The processor of claim 10, further comprising an equalization controller configured to activate the equalization control signal in response to determining that the first logic circuit is transitioning from an active state to an inactive state and the second logic circuit is transitioning from an inactive state to an active state, or in response to determining that the first logic circuit is transitioning from an inactive state to an active state and the second logic circuit is transitioning from an active state to an inactive state.

13. The processor of claim 10, wherein the first logic circuit includes logic configured to perform array read operations, and wherein the second logic circuit includes logic configured to perform array write operations.

14. The processor of claim 10, wherein the first logic circuit corresponds to a first subarray of a storage array, and wherein the second logic circuit corresponds to a second subarray of the storage array.

15. The processor of claim 14, wherein the first subarray and the second subarray correspond to respective ways or banks of a cache.

16. The processor of claim 10, wherein the first logic circuit corresponds to an upstream component of a multi-stage logic path, and wherein the second logic circuit corresponds to a downstream component of the multi-stage logic path.

17. The processor of claim 16, wherein the upstream component is configured to activate a word line during a storage array access.

18. A method, comprising:
generating, by an equalization controller circuit, state information indicative of operating state of a first logic circuit and a second logic circuit, wherein the first logic circuit is coupled to a source power supply node and the second logic circuit is coupled to a destination power supply node;
dependent upon the state information, activating, by the equalization controller circuit, an equalization control signal;
generating, by a source node control circuit, a source node input to a pulldown network, wherein the source node control circuit is coupled to the source power supply node and an inverted version of the equalization control signal, and wherein a control input of the source node control circuit is coupled to the destination power supply node;
generating, by the pulldown network, an activation signal dependent upon the source node input to the pulldown network and the equalization control signal; and
transferring charge between the source power supply node and the destination power supply node via an equalization device in response to the activation signal, wherein during the transferring of charge, the equalization activation circuit prevents coupling of the source power supply node to ground.

19. The method of claim 18, wherein activating the equalization control signal dependent upon the state information comprises activating the equalization control signal in response to determining that the first logic circuit is transitioning from an active state to an inactive state and the second logic circuit is transitioning from an inactive state to an active state, or in response to determining that the first logic circuit is transitioning from an inactive state to an active state and the second logic circuit is transitioning from an active state to an inactive state.

20. The method of claim 18, wherein the pulldown network comprises a pulldown inverter coupled to ground via at least a first pulldown n-type field effect transistor (NFETs), wherein the first pulldown NFETs is coupled to the source node input, wherein an output of the pulldown inverter is coupled to selectively control the equalization device, and wherein an input of the pulldown inverter is coupled to the equalization control signal; and
wherein the source node control circuit comprises a source node PFET and a source node control inverter coupled in series between the source power supply node and ground, wherein a gate of the source node PFET corresponds to the control input of the source node control circuit that is coupled to the destination power supply node, wherein an input of the source node control inverter is coupled to an inverted version of the equalization control signal, and wherein an output of the source node control inverter is coupled to the source node input to the pulldown network.

* * * * *

UNITED STATES PATENT AND TRADEMARK OFFICE
CERTIFICATE OF CORRECTION

PATENT NO. : 9,584,122 B1
APPLICATION NO. : 15/189134
DATED : February 28, 2017
INVENTOR(S) : Edward M. McCombs et al.

Page 1 of 1

It is certified that error appears in the above-identified patent and that said Letters Patent is hereby corrected as shown below:

On the Title Page

Item (54) and in the Specification, Line 2, Title, please change "CHARGE" and substitute --CHARGE REUSE--.

Signed and Sealed this
Thirtieth Day of May, 2017

Michelle K. Lee
*Director of the United States Patent and Trademark Office*